United States Patent
Chen et al.

(10) Patent No.: US 7,596,028 B2
(45) Date of Patent: Sep. 29, 2009

(54) VARIABLE PROGRAM AND PROGRAM VERIFICATION METHODS FOR A VIRTUAL GROUND MEMORY IN EASING BURIED DRAIN CONTACTS

(75) Inventors: Ming Shiang Chen, Hsinchu (TW); Wen Pin Lu, Hsinchu (TW); I-Jen Huang, Kaohsiung (TW); Chi Yuan Chin, Taipei (TW); Nian-Kai Zous, Ping Zhen (TW)

(73) Assignee: Macronix International Co., Ltd., Hsinchu (TW)

( * ) Notice: Subject to any disclaimer, the term of this patent is extended or adjusted under 35 U.S.C. 154(b) by 27 days.

(21) Appl. No.: 11/617,007

(22) Filed: Dec. 28, 2006

(65) Prior Publication Data

US 2008/0158966 A1 Jul. 3, 2008

(51) Int. Cl.
*G11C 11/34* (2006.01)
(52) U.S. Cl. .................. 365/185.18; 365/185.24; 365/185.02; 365/185.05; 365/185.26
(58) Field of Classification Search ............ 365/185.18, 365/185.24, 185.02, 185.05, 185.26
See application file for complete search history.

(56) References Cited

U.S. PATENT DOCUMENTS

| | | | | |
|---|---|---|---|---|
| 5,483,486 | A * | 1/1996 | Javanifard et al. | 365/185.17 |
| 5,566,125 | A * | 10/1996 | Fazio et al. | 365/45 |
| 5,594,360 | A * | 1/1997 | Wojciechowski | 324/771 |
| 5,671,179 | A * | 9/1997 | Javanifard | 365/185.33 |
| 5,719,427 | A * | 2/1998 | Tong et al. | 257/355 |
| 5,768,193 | A * | 6/1998 | Lee et al. | 365/185.25 |
| 5,912,837 | A * | 6/1999 | Lakhani | 365/185.02 |
| 5,912,845 | A | 6/1999 | Chen et al. | |
| 6,031,766 | A | 2/2000 | Chen et al. | |
| 6,166,955 | A | 12/2000 | Lu et al. | |
| 6,184,724 | B1 * | 2/2001 | Lin | 327/80 |
| 6,363,013 | B1 | 3/2002 | Lu et al. | |
| 6,563,752 | B2 * | 5/2003 | Tsai et al. | 365/201 |
| 6,614,687 | B2 | 9/2003 | Chen et al. | |
| 6,762,956 | B2 * | 7/2004 | Mori et al. | 365/185.33 |
| 6,987,048 | B1 * | 1/2006 | Cheng et al. | 438/262 |
| 7,067,374 | B2 | 6/2006 | Han et al. | |
| 7,184,317 | B2 * | 2/2007 | Roehr et al. | 365/185.28 |
| 7,342,829 | B2 * | 3/2008 | Koebernick et al. | 365/185.19 |

* cited by examiner

*Primary Examiner*—Viet Q Nguyen
(74) *Attorney, Agent, or Firm*—Haynes Beffel & Wolfeld LLP

(57) ABSTRACT

Methods for programming and program verification of a flash memory are described that ease the buried drain contact induced operation and increase the retention window. In a first aspect of the invention, a program operation method provides varying program biases which are applied to different groups of memory cells. The program biases can be supplied as drain bias voltages or gate bias voltages. The program biases vary depending on which group of memory cells is programmed. In one embodiment, a first drain voltage $V_{D1}$ is applied to the first group of memory cells $M_0$ and $M_n$. A second drain voltage $V_{D2}$ is applied to the second group of memory cells $M_1$ and $M_{n-1}$, where $V_{D2}=V_{D1}+\Delta V_D$. In a second aspect of the invention, a plurality of program verification voltage levels are selected to verify that the memory cells pass the program voltage levels.

20 Claims, 4 Drawing Sheets

VARIABLE PROGRAM AND PROGRAM VERIFICATION METHODS FOR A VIRTUAL GROUND MEMORY IN EASING BURIED DRAIN CONTACTS

BACKGROUND OF THE INVENTION

1. Field of the Invention

The present invention relates generally to electrically programmable and erasable memory and, more particularly, to methods for easing the buried contact induced operation and increasing the reliability window of a nitride trapping memory.

2. Description of Related Art

Electrically programmable and erasable nonvolatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names charge trapping memory, SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Charge trapping memory devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of a charge trapping flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious as the technology continues to scale down.

A typical flash memory cell structure positions a tunnel oxide layer between a conducting polysilicon tunnel oxide layer and a crystalline silicon semiconductor substrate. The substrate includes a source region and a drain region separated by an underlying channel region. A flash memory read can be executed by a drain sensing or a source sensing. For source side sensing, one or more source lines are coupled to source regions of memory cells for reading current from a particular memory cell in a memory array.

A traditional floating gate device stores 1 bit of charge in a conductive floating gate. The advent of charge trapping memory cells in which each charge trapping memory cell provides 2 bits of flash cells that store charge in an Oxide-Nitride-Oxide (ONO) dielectric. In a typical structure of a charge trapping memory memory cell, a nitride layer is used as a trapping material positioned between a top oxide layer and a bottom oxide layer. The ONO layer structure effectively replaces the gate dielectric in floating gate devices. The charge in the ONO dielectric with a nitride layer may be either trapped on the left side or the right side of a charge trapping memory cell.

A frequently used technique to program charge trapping memory cells in a charge trapping memory array is the hot electron injection method. During an erase operation, a common technique used to erase memory cells is called the band-to-band tunneling hot hole injection technique, where the eraseability is highly dependent on the lateral electric field. The other side potential, from the side that is being erased, of a charge trapping memory cell, is likely to have a lateral electric field effect on the eraseability. Evaluating the endurance and retention of a charge trapping memory array, the lack of uniformity in eraseability causes a margin loss due to cycling and baking. The other side of charge trapping memory cells are left floating (or connected to ground) and may be coupled to an uncertain voltage level (e.g. 1 volt or 4 volts), which causes a variation of the erase threshold of array cells. This in turn causes Vt distribution to be wider after an erase operation.

In a conventional program algorithm of a flash memory, a channel hot electron program is applied to the flash memory with a program voltage. The flash memory is then program verified by a program verify voltage. Such an algorithm produces a significant loading induced voltage threshold differential between flash memory cells. The retention loss window is also reduced, particularly for flash memory cells nearing contact cells. Accordingly, it is desirable to have methods that ease buried drain contact induced operation and which also enhance the reliability of a flash memory

SUMMARY OF THE INVENTION

The present disclosure describes methods for programming and program verification of a flash memory including a multiple virtual ground AND (MXVAND) method that eases the buried drain contact induced operation and increases a retention window. The virtual ground memory comprises an array of memory cells connected to a plurality of bit lines where each bit line extends in a direction that connects to a plurality of memory cells $M_0$ through $M_n$. The plurality of memory cells $M_0$ through $M_n$ connected to a particular bit line is divided into multiple groups or sets of memory cells by word lines depending on the location of a memory cell. In one embodiment, a first group of memory cells $M_0$ and $M_n$, associated with word lines $WL_0$ and $WL_n$, is defined to include the two outer memory cells that are adjacent (or next) to contacts. A second group of memory cells $M_1$ and $M_{n-1}$, associated with word lines $WL_1$ and $WL_{n-1}$, is defined to include the two memory cells that are not adjacent to the contacts but instead each of the two memory cells $M_1$ and $M_{n-1}$ is located as the second memory cell away from a contact. A third group of memory cells $M_2$ and $M_{n-2}$, associated with word lines $WL_2$ and $WL_{n-2}$, is defined to include the two memory cells that are not adjacent to the contacts but instead each of the two memory cells $M_2$ and $M_{n-2}$ is located as the third memory cell away from a contact.

In a first aspect of the invention, a program operation method provides varying program biases which are applied to different groups of memory cells. The program biases can be supplied as drain bias voltages or gate bias voltages. The program biases vary depending on which group of memory cells are programmed. In one embodiment a first drain voltage $V_{D1}$ is applied to the first group of memory cells $M_0$ and $M_n$. A second drain voltage $V_{D2}$ is applied to the second group of memory cells $M_1$ and $M_{n-1}$, where $V_{D2}=V_{D1}+\Delta V_D$. A third drain voltage $V_{D3}$ is applied to the third group of memory cells $M_2$ and $M_{n-2}$ where $V_{D3}=V_{D1}+2\Delta V_D$. The varying drain voltages of $V_{D1}$, $V_{D2}$, $V_{D3}$ are intended as an illustration. Other voltage settings, relationships, modifications or adaptations between $V_{D1}$, $V_{D2}$, $V_{D3}$, such as the second drain voltage $V_{D2}$ being about the same voltage as the third drain voltage $V_{D3}$, or the second and third drain voltages $V_{D2}$, $V_{D3}$ being set at a predetermined voltage value, can be practiced without departing from the spirit of the present invention. In an alternative embodiment, a gate bias voltage $V_G$ can be applied to the different groups of memory cells instead of being applied with a drain voltage $V_D$. The varying drain bias voltages ease the bit line loading that is induced by a program current. When the drain bias voltages of the different groups of memory cells are similar, the threshold voltage $V_t$ distribution is contained and the widening of the threshold voltage $V_t$ by a loading effect can be minimized.

In a second aspect of the invention, a plurality of program verify voltage levels is selected to verify that the memory cells pass the program verify voltage levels. The first group of memory cells that is adjacent to contacts undergoes a program verification process. If the first group of memory cells has passed the first program verify voltage level PV1, the process for the first group of memory cells is completed. If the first group of memory cells does not pass the first program verify voltage level PV1, the first group of memory cells returns to the step of programming the first group of memory cells. This iterative process continues until the first group of memory cells passes the first program verify voltage level PV1. Similarly, the second group of memory cells that is located away from the contacts undergoes a program verification process. If the second group of memory cells has passed the second program verify voltage level PV2, the process for the second group of memory cells is completed. If the second group of memory cells does not pass the second program verify voltage level PV2, the second group of memory cells returns to the step of programming the second group of memory cells. This iterative process continues until the second group of memory cells passes the second program verify voltage level PV2. In one embodiment, the first program verify voltage level PV1 is a higher value than the second program verify voltage level PV2. The higher voltage threshold Vt for the contact cells (or memory cells adjacent to the contacts), as indicated by the fact that the first program verify voltage level PV1 is a higher value than the second program verify voltage level PV2, enlarges the retention window.

Broadly stated, a method for programming a virtual ground memory having a plurality of bit lines, a bit line connecting a plurality of memory cells M0 through Mn with the memory cell M0 at a first location on the bit line, the memory cell M1 at a second location on the bit line, the memory cell M2 on a third location on the bit line, the memory cell Mn-2 at a fourth location on the bit line, the memory cell Mn-1 at a fifth location on the bit line, the memory cell Mn at a sixth location on the bit line, the plurality of memory cells M0 through Mn divided into a first set of memory cells and a second set of memory cells comprises programming the first set of memory cells by applying a first bias voltage to the first set of memory cells, the first set of memory cells including memory cell M0 at the first location on the bit line and the memory cell Mn at the sixth location on the bit line, the memory cell M0 at the first location and the memory cell Mn at the sixth location are the contact cells on the bit line; and programming the second set of memory cells by applying a second bias voltage to the second set of memory cells, the second set of memory cells including the memory cell M1 at the second location on the bit line and the memory cell Mn-1 at the fifth location on the bit line, the memory cells M1 and Mn-1 located away from the contacts; wherein the second bias voltage has a voltage value that is sufficiently larger than the first bias voltage to ease the loading induced program distribution on the bit line.

Advantageously, the present invention provides methods that ease the buried drain contact induced operation and enhance the reliability of a flash memory. The present invention also advantageously provides a tighter program distribution. The present invention further provides a larger reliability window by programming the contact cells to a higher program voltage threshold.

The structures and methods of the present invention are disclosed in the detailed description below. This summary does not purport to define the invention. The invention is defined by the claims. These and other embodiments, features, aspects, and advantages of the invention will be better understood with reference to the following description, claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
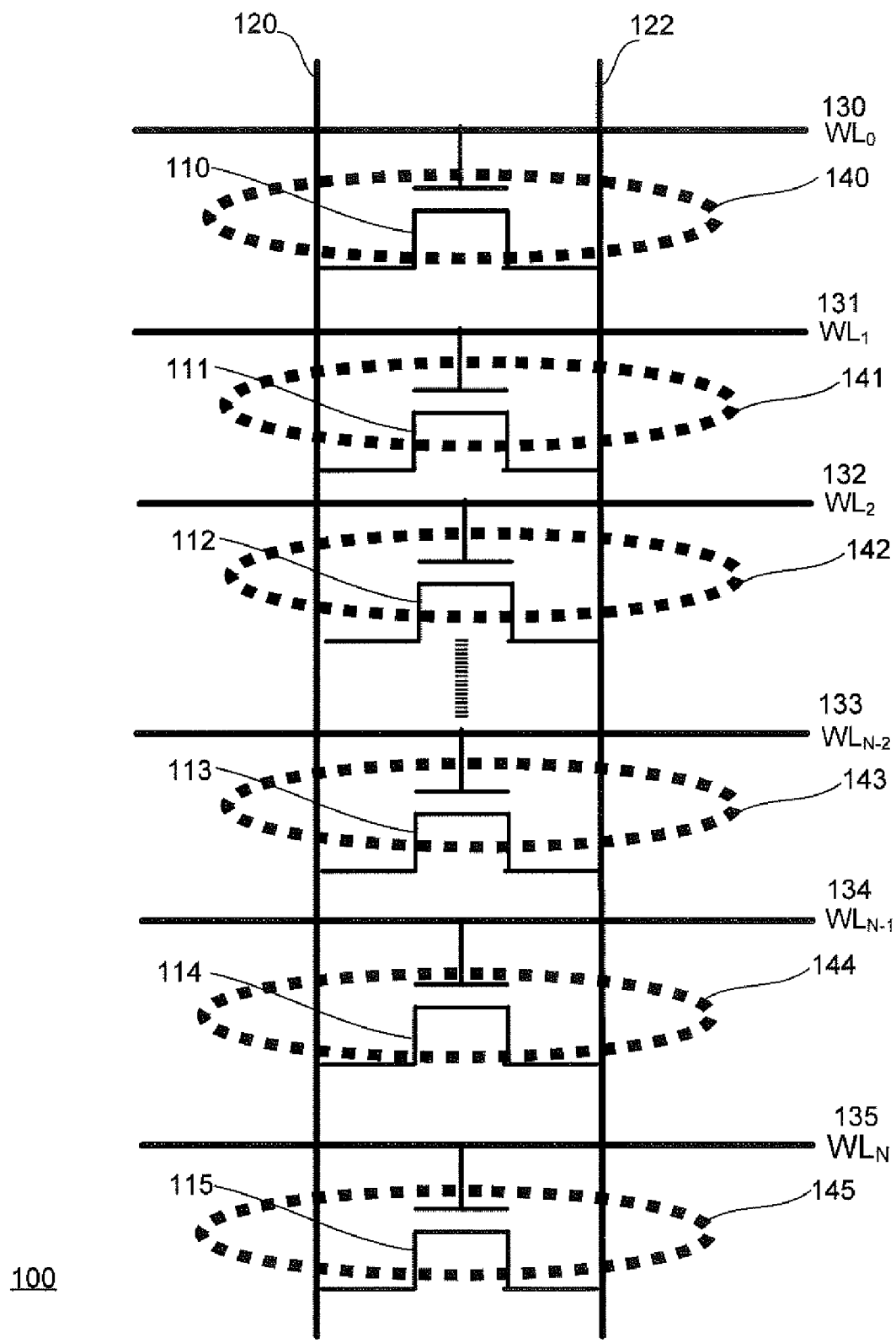
FIG. 1 is a simplified circuit diagram illustrating a memory circuit that groups a plurality of memory cells along a bit line with intersecting word lines and applies variable bias voltages along the bit line in accordance with the present invention.

A description of structural embodiments and methods of the present invention is provided with reference to FIGS. 1-4. It is to be understood that there is no intention to limit the invention to the specifically disclosed embodiments but that the invention may be practiced using other features, elements, methods and embodiments. Like elements in various embodiments are commonly referred to with like reference numerals.

Referring now to FIG. 1, there is shown a simplified circuit diagram illustrating a memory circuit 100 that groups a plurality of memory cells along a bit line with intersecting word lines and applies variable bias voltages along the bit line. The memory circuit 100 comprises a plurality of transistors 110, 111, 112, 113, 114, 115 that have their respective drain and source regions connected to two parallel bit lines 120, 122. The first bit line 120 and the second bit line 122 intersect with word lines $WL_0$ 130, $WL_1$ 131, $WL_2$ 132, $WL_{N-2}$ 133, $WL_{N-1}$ 134, $WL_N$ 135. The first and second bit lines 120, 122 extend in a first direction, and the word lines $WL_0$ 130, $WL_1$ 131, $WL_2$ 132, $WL_{N-2}$ 133, $WL_{N-1}$ 134, $WL_N$ 135 extend in a second direction, wherein the first direction is orthogonal to the second direction. The encircled areas 140, 141, 142, 143, 144, 145 identify respective transistor 110, 111, 112, 113, 114 or 115, the location of which corresponds with the amount of voltage applied. The encircled area 140 corresponds with a voltage that is applied to a contact cell, and the encircled area 145 corresponds with a voltage that is applied to a contact cell.

Several different methods can be applied to achieve a more even voltage distribution. In one embodiment, a higher threshold voltage $V_T$ is obtained for the contact cells, i.e. the transistors 110 and 115, that are located on the most upper end and on the most lower end of the first and second bit line 120. For the contact cells in the transistors 110, 115, a drain voltage $V_D$ is applied to the first line 120 for the contact cells in the transistors 110, 115 during programming. One or more $\Delta V_D$ are added to the drain voltage $V_D$ for the memory cells in the memory circuit 100 depending on the location of memory cells. A memory cell that is one memory cell away from a contact cell adds one $\Delta V_D$ to compensate for the drop in the bit line voltage. Thus, a voltage of $V_D+\Delta V_D$ is applied for the transistor 112 because the transistor 112 is adjacent to the contact cell of the transistor 110. A voltage of $V_D+\Delta V_D$ is applied for the transistor 114 because the transistor 114 is adjacent to the contact cell of the transistor 116. If a memory cell is located two memory cells away from a contact cell, then two $\Delta V_D$ are added to $V_D$ in order to compensate for the drop in the bit line voltage. Therefore, a voltage of $V_D+2\Delta V_D$ is applied for the transistor 112 because the transistor 112 is located two memory cells away from the contact cell of the transistor 110. A voltage of $V_D+2\Delta V_D$ is applied for the transistor 113 because the transistor 113 is located two memory cells away from the contact cell of the transistor 145.

In another embodiment, the threshold voltage compensation to memory cells in the first bit line 120 can be selected to be a predetermined voltage amount, rather than measuring by the multiple of $\Delta V_D$. For example, a $V_D$ voltage plus a first fixed voltage amount, such as 0.5 volts can be applied to the bit line for the two adjacent memory cells 111, 114 from the contact cells 110, 115. A $V_D$ voltage, plus a second fixed voltage amount, such as 1.0 volt, where the second fixed voltage amount is larger than the first fixed voltage amount, can be applied to the bit line for the two memory cells 112, 113, which are two memory cells away from the contact cells 110, 115.

In a further embodiment, a gate voltage $V_G$ is used as the bias voltage instead of the drain voltage $V_D$ during programming. One or more $\Delta V_G$ are added to the gate voltage $V_G$ for the memory cells in the memory circuit 100 depending on the location of the memory cells. A memory cell that is located one memory cell away from a contact cell adds one $\Delta V_G$ to compensate for the drop in the bit line voltage. Thus, a voltage of $V_G+\Delta V_G$ is applied to the encircled areas 141 in the transistor 112 because the transistor 112 is adjacent to the contact cell of the transistor 110. A voltage of $V_G+\Delta V_G$ is applied to the encircled areas 144 in the transistor 114 because the transistor 114 is adjacent to the contact cell of the transistor 116. If a memory cell is located two memory cells away from a contact cell, then two $\Delta V_G$ are added to $V_G$ in order to compensate for the drop in the bit line voltage. Therefore, a voltage of $V_G+2\Delta V_G$ is applied to the encircled areas 142 with the transistor 112 because the transistor 112 is located two memory cells away from the contact cell of the transistor 110. A voltage of $V_G+2\Delta V_G$ is applied to the encircled areas 143 with the transistor 113 because the transistor 113 is located two memory cells away from the contact cell of the transistor 116.

Figure 2:
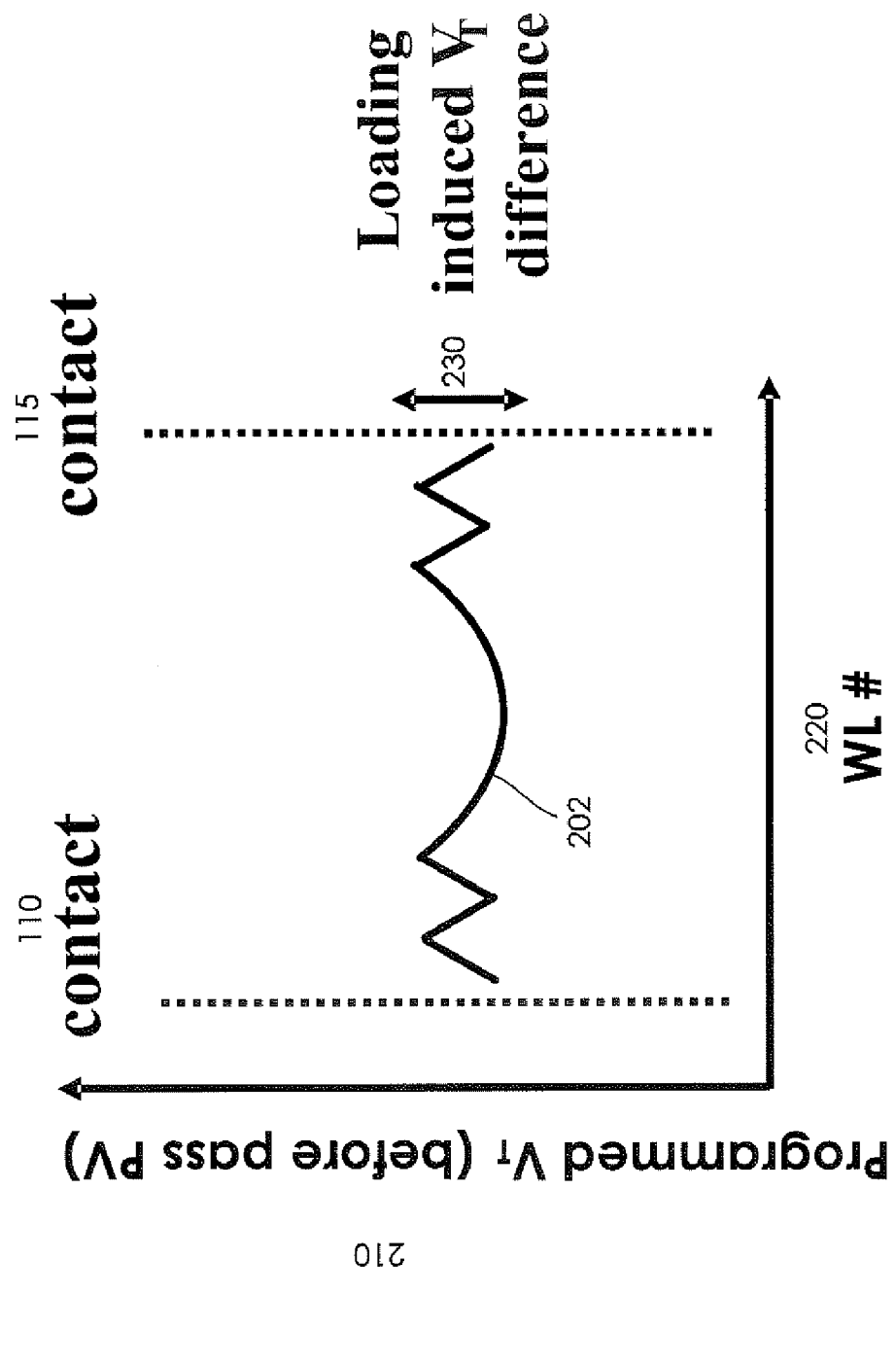
FIG. 2 is a graph illustrating loading induced voltage threshold $V_T$ differentials for various word lines in accordance with the present invention.

FIG. 2 is a graph 200 illustrating a loading induced voltage threshold VT differential for various word lines. The y-axis 210 represents a programmed voltage threshold voltage VT before passing the program voltage, and the x-axis 220 represents the number of word lines. The threshold voltages on each end of contact cells 110, 115 are about the same. The location of inner memory cells relative to the contact cells 110, 115 may have some slight voltage variations. With the methods for compensating for the variance in the threshold voltages as described above with respect to FIG. 2, the result produces a curve 202 over multiple word lines 220 where the loading induced voltage threshold voltage $V_T$ differential 230 is relatively small.

Figure 3:
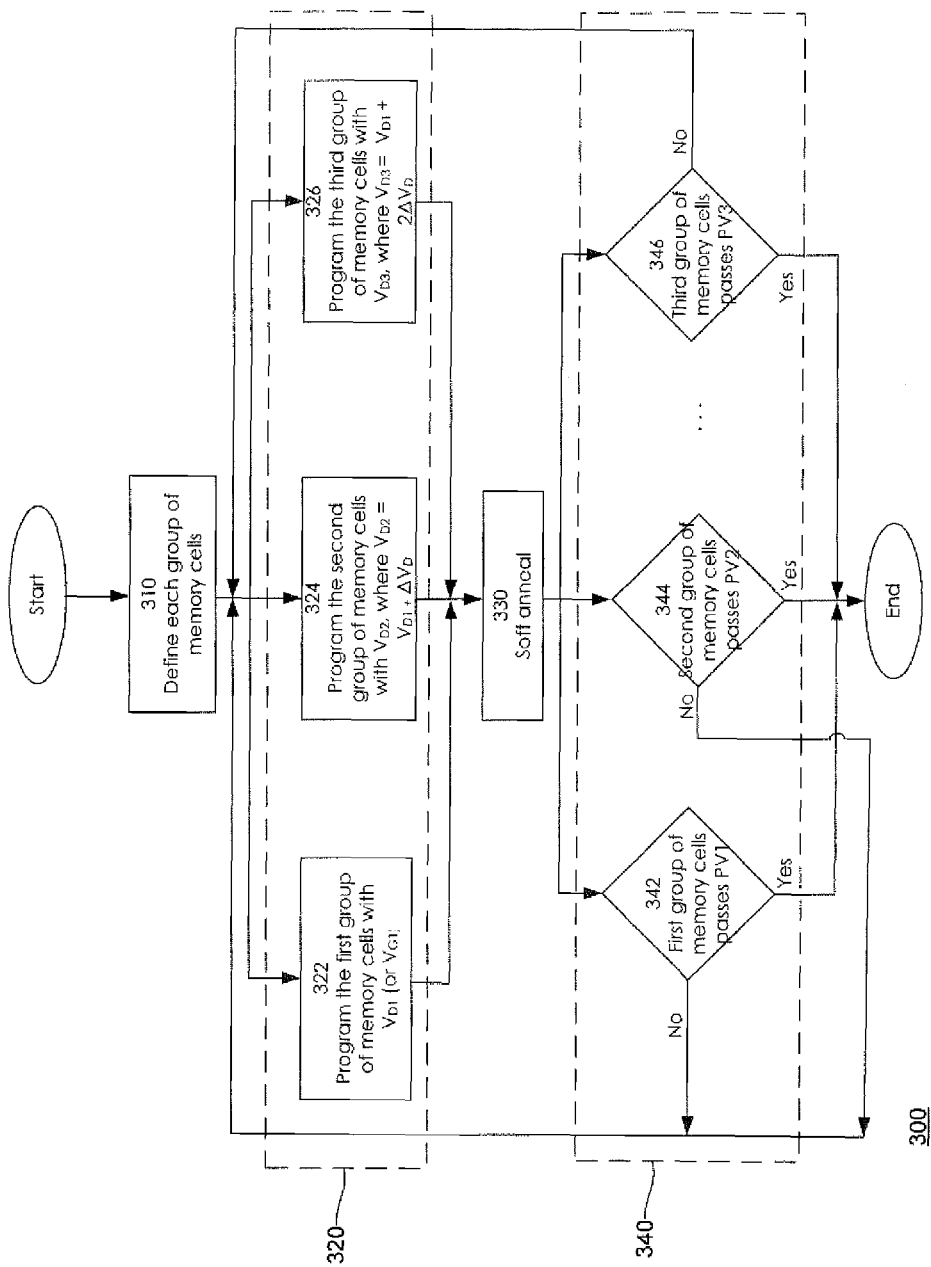
FIG. 3 is a flow diagram illustrating a method for programming a voltage threshold of contact cells to a higher level, which results in enlarging the retention window in accordance with the present invention.

In FIG. 3, there is shown a flow diagram illustrating a method 300 for programming a voltage threshold of contact cells to a higher level, which results in enlarging the retention window. At step 310, the memory cells 110-115 are defined into different groups, such as a first group or set of memory cells including memory cells 110, 115, a second group or set of memory cells including memory cells 111, 114, and a third group or set of memory cells including memory cells 112, 113. The different groups or sets of memory cells 110-115 undergo programming at step 320 and program verification at step 340. The programming process at step 320 includes sub-programming steps 322, 324, 326 for parallel programming for multiple groups of memory cells 110-115. In one embodiment, a drain voltage $V_D$ serves as the basic programming voltage relative to other programming voltages. At step 322, the first group of memory cells 110, 115 are programmed with the first drain voltage $V_{D1}$. At step 324, the second group of memory cells 111, 114 is programmed with the second drain voltage $V_{D2}$, where the parameter is $V_{D2}=V_{D1}+\Delta V_D$. At step 326, the third group of memory cells 112, 113 is programmed with the third drain voltage $V_{D3}$, where the parameter is $V_{D3}=V_{D1}+2\Delta V_D$. The relative ratio between the first, second and third drain voltages $V_{D1}$, $V_{D2}$, $V_{D3}$ can be set by the number of $\Delta V_D$, or by simply setting a fixed voltage value for each drain voltage. Exemplary parameters for the first, second or third drain voltage $V_{D1}$, $V_{D2}$, $V_{D3}$ range from 2 volts to 7 volts, preferably selecting a voltage value between 3 volts to 6 volts.

In an alternative embodiment, a first gate voltage $V_{G1}$ is used to program the first group of memory cells 10, 115. The second group of memory cells 111, 114 is programmed with the second gate voltage $V_{G2}$, where $V_{G2}=V_{G1}+\Delta V_G$. The third group of memory cells 112, 113 is programmed with the third gate voltage $V_{G3}$, where $V_{G3}=V_{G1}+2\Delta V_G$. The relative ratio between the first, second and third gate voltages $V_{G1}$, $V_{G2}$, $V_{G3}$ can be determined by the number of $\Delta V_G$, or simply by setting a fixed voltage value for each gate voltage. Exemplary parameters for the first, second or third gate voltage $V_{G1}$, $V_{G2}$, $V_{G3}$ range from 4 volts to 15 volts, preferably selecting a voltage value between 5 volts to 11 volts.

As an optional step, soft anneal at step 330, includes applying a positive gate bias to inject some electrons from the substrate of a memory cell to eliminate the positive oxide charges generated during an erase operation. Since the positive charge in a bottom oxide reduces the tunneling barrier, which forms a leak path from a storage node to the substrate, the effect of the soft anneal operation suppresses the leak path, thereby increasing the long term charge storage time.

During a program operation, some injected electrons may also be trapped in the bottom oxide. The excess electrons, which are not stored in the storage node, tend to drift out within a short period of time, such as one second. Soft anneal step 330 also includes the application of a negative gate bias to repel the electrons, which assists in increasing the charge storage time.

Exemplary conditions for the soft anneal are set forth below. First, when there is a positive charge in an oxide layer of a memory cell, a soft anneal process is applied to repel the positive charge, with the following parameter conditions: a positive gate voltage +$V_G$, the parameter $V_G$-$V_B$ between about 3 to about 13 volts, and $V_D$=$V_S$>−13 volts where the source voltage Vs is substantially the same as the voltage potential of the drain voltage $V_D$. Second, when there is a negative charge in an oxide layer of a memory cell, a soft anneal process is applied to repel the negative charge, with the parameter conditions: a negative gate voltage −$V_G$, the parameter $V_G$-$V_B$ between −3 to −13 volts, $V_D$=$V_S$<13 volts where the source voltage Vs is substantially the same as the voltage potential of the drain voltage $V_D$.

The program verification process is conducted at step 340, which includes sub-programming verification process steps 342, 344, 346 that are carried out in parallel with one another. At step 342, the first group of memory cells 110, 115 undergoes a program verification process to determine whether the voltages in the first group of memory cells 110, 115 pass a first program verify voltage PV1. If the first group of memory cells 110, 115 passes the first program verify voltage PV1, the process 300 is complete. However, if the first group of memory cells 110, 115 does not pass the first program verify voltage PV1, step 322 is repeated for her programming of the first group of memory cells 110, 115. This iterative process continues for the first group of memory cells 110, 115 until the first group of memory cells 110, 115 passes the first program verify voltage PV1.

At step 344, the second group of memory cells 111, 114 undergoes a program verification process to determine whether the voltages in the second group of memory cells 111, 114 pass a second program verify voltage PV2. If the second group of memory cells 111, 114 passes the second program verify voltage PV2, the process 300 is complete. However, if the second group of memory cells 111, 114 does not pass the second program verify voltage PV2, step 324 is repeated for further programming of the second group of memory cell 111, 114. This iterative process continues for the second group of memory cells 111, 114 until the second group of memory cells 111, 114 passes the second program verify voltage PV2.

At step 346, the third group of memory cells 112, 113 undergoes a program verification process to determine whether the voltages in the third group of memory cells 112, 113 pass a third program verify voltage PV3. If the third group of memory cells 112, 113 passes the third program verify voltage PV3, the process 300 is complete. However, if the third group of memory cells 112, 113 does not pass the third program verify voltage PV3, step 326 is repeated for further programming of the third group of memory cell 112, 113. This iterative process continues for the third group of memory cells 112, 113 until the third group of memory cells 112, 113 passes the third program verify voltage PV3. Exemplary parameters for the first, second or third program verify voltage PV1, PV2, PV3 range from 4 volts to 10 volts, preferably selecting a voltage value between 5 volts to 9 volts.

Figure 4:
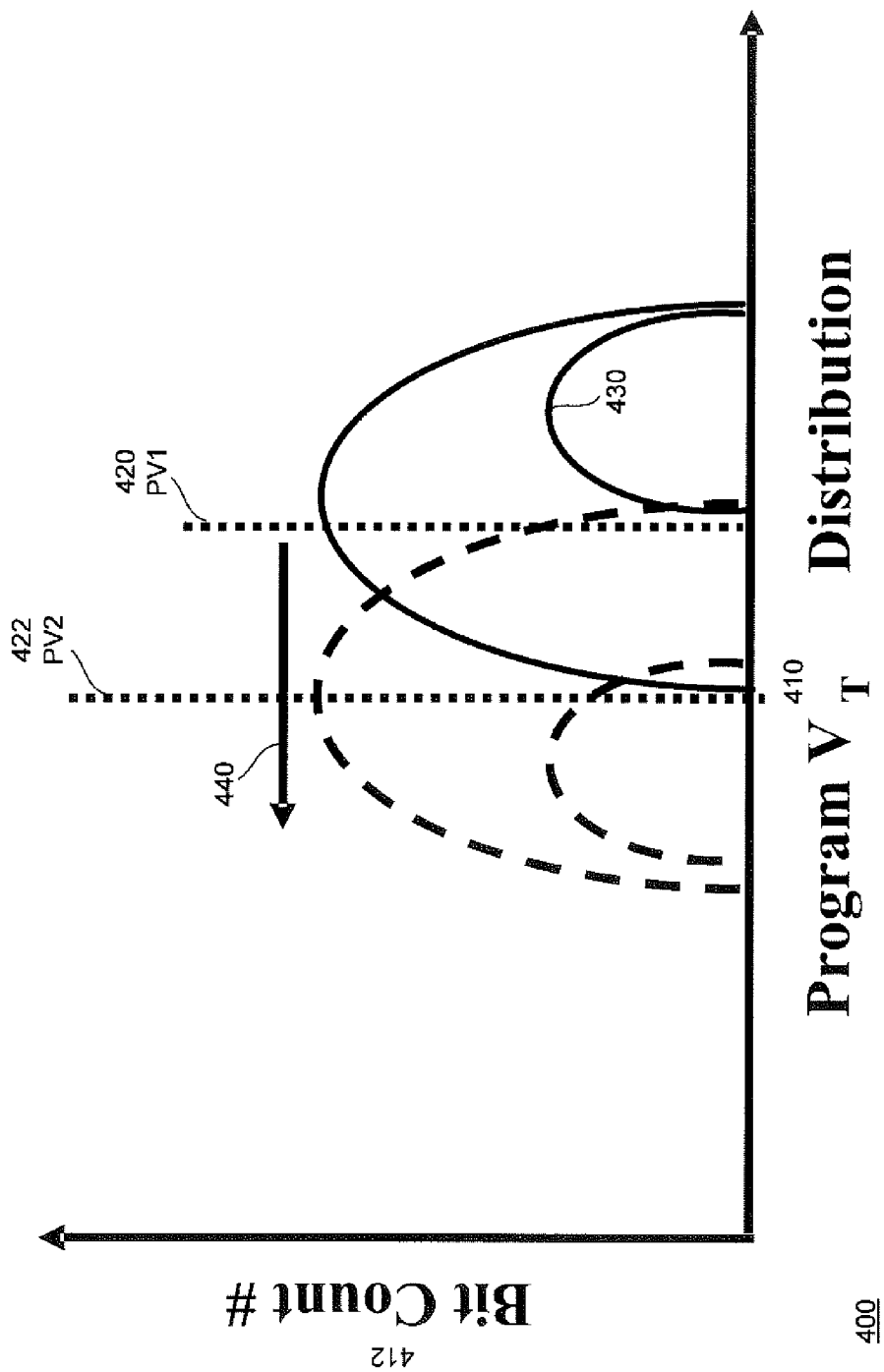
FIG. 4 is a graph illustrating the memory circuit employing two or more program verify levels to increase the retention window for memory cells adjacent to contacts in accordance with the present invention.

FIG. 4 is a graph 400 illustrating the memory circuit 100 employing two or more program verify voltage levels to increase the retention window for memory cell adjacent to contacts. The x-axis 410 of the graph 400 represents the program voltage threshold distribution and the y-axis 412 of the graph 400 represents the number of bit counts. A first program verify voltage PV1 420 is associated with the first group of memory cells (or contact cells, or memory cells adjacent to contacts) 110, 115. A second program verify voltage PV2 422 is associated with the second group of memory cells 111, 114. In this embodiment, the first program verify voltage PV1 420 has a higher voltage threshold value than the second program verify voltage PV2 422. During the program verification process, the first group of memory cells that is adjacent to contacts needs to reach a higher threshold voltage value in order to pass the first program verify voltage PV1 420, as shown by a curve 430. An arrow 440 indicates the amount of retention loss. Because the first group of memory cells 110, 115 needs to pass the higher threshold voltage value of the first program verify voltage PV1, the retention window is therefore larger for the first group of memory cells 110, 115 that are located adjacent to contacts.

The invention has been described with reference to specific exemplary embodiments. For example, the method in the present invention is applicable to any type or variation of a nitride trapping memory including various types of virtual ground arrays and both N-channel and P-channel SONOS types of devices and floating gate memory. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A method for programming a memory device comprising a plurality of memory cells arranged in a sequence along a bit line and having respective first terminals electrically coupled to the bit line, respective threshold voltages, and respective gate terminals, the plurality of memory cells including a first memory cell in the sequence and nearest a first contact electrically coupled to the bit line, the method comprising:
   applying a first bias voltage to the bit line; and
   applying a second bias voltage to the gate terminal of a particular memory cell in the plurality of memory cells to change the threshold voltage of the particular memory cell, the first and second bias voltages differing by an amount dependent upon a location of the particular memory cell from the first contact, wherein the first bias voltage is dependent upon the location of the particular memory cell from the first contact, and the second bias voltage is independent of the location of the particular memory cell from the first contact.

2. The method of claim 1, wherein:
   the memory device further comprises a plurality of word lines, the gate terminal of the memory cells in the plurality of memory cells electrically coupled to a corresponding word line in the plurality of word lines; and
   the applying a second bias voltage comprises applying the second bias voltage to the word line corresponding to the particular memory cell.

3. The method of claim 1, wherein:
   the plurality of memory cells includes a second memory cell adjacent the first memory cell; and
   the first memory cell in the sequence has a first minimum threshold voltage corresponding to a programmed state, and the second memory cell has a second minimum threshold voltage corresponding to a programmed state, the first minimum threshold voltage being greater than second minimum threshold voltage by a predetermined threshold voltage.

4. The method of claim 1, wherein:

the plurality of memory cells includes a second memory cell adjacent the first memory cell;

the difference between the first and second bias voltages being a first voltage difference if the particular memory cell is the first memory cell; and the difference between the first and second bias voltages being a second voltage difference if the particular memory cell is the second memory cell, the second voltage difference being different from the first voltage difference by a first predetermined voltage.

5. The method of claim 4, wherein:

the plurality of memory cells includes a third memory cell adjacent the second memory cell; and the difference between the first and second bias voltages being a third voltage difference if the particular memory cell is the third memory cell, the third voltage difference being different from the second voltage difference by a second predetermined voltage.

6. The method of claim 1, wherein:

the plurality of memory cells includes a last memory cell in the sequence and nearest a second contact electrically coupled to the bit line; and the first and second bias voltages differing by an amount further dependent upon a location of the particular memory cell from the second contact.

7. The method of claim 6, wherein:

the first bias voltage is dependent upon at least one of the respective locations of the particular memory cell from the first and second contacts; and the second bias voltage is independent of the respective locations of the particular memory cell from the first and second contacts.

8. The method of claim 6, wherein:

the plurality of memory cells includes a second memory cell adjacent the first memory cell and a third memory cell adjacent the last memory cell; and the first and last memory cells in the sequence have a first minimum threshold voltage corresponding to a programmed state, and the second and third memory cells have a second minimum threshold voltage corresponding to a programmed state, the first minimum threshold voltage being greater than the second minimum threshold voltage by a predetermined threshold voltage.

9. A method for programming a memory device comprising a plurality of memory cells arranged in a sequence along a bit line and having respective first terminals electrically coupled to the bit line, respective threshold voltages, and respective gate terminals, the plurality of memory cells including a first memory cell in the sequence and nearest a first contact electrically coupled to the bit line, the method comprising:

applying a first bias voltage to the bit line; and applying a second bias voltage to the gate terminal of a particular memory cell in the plurality of memory cells to change the threshold voltage of the particular memory cell, the first and second bias voltages differing by an amount dependent upon a location of the particular memory cell from the first contact, and wherein:

the plurality of memory cells includes a second memory cell adjacent the first memory cell; and the first memory cell in the sequence has a first minimum threshold voltage corresponding to a programmed state, and the second memory cell has a second minimum threshold voltage corresponding to a programmed state, the first minimum threshold voltage being greater than second minimum threshold voltage by a predetermined threshold voltage.

10. The method of claim 9, wherein:

the memory device further comprises a plurality of word lines, the gate terminal of the memory cells in the plurality of memory cells electrically coupled to a corresponding word line in the plurality of word lines; and the applying a second bias voltage comprises applying the second bias voltage to the word line corresponding to the particular memory cell.

11. The method of claim 9, wherein:

the first bias voltage is independent of the location of the particular memory cell from the first contact; and the second bias voltage is dependent upon the location of the particular memory cell from the first contact.

12. The method of claim 9, wherein:

the first bias voltage is dependent upon the location of the particular memory cell from the first contact; and the second bias voltage is independent of the location of the particular memory cell from the first contact.

13. The method of claim 9, wherein:

the difference between the first and second bias voltages being a first voltage difference if the particular memory cell is the first memory cell; and the difference between the first and second bias voltages being a second voltage difference if the particular memory cell is the second memory cell, the second voltage difference being different from the first voltage difference by a first predetermined voltage.

14. The method of claim 13, wherein:

the plurality of memory cells includes a third memory cell adjacent the second memory cell; and the difference between the first and second bias voltages being a third voltage difference if the particular memory cell is the third memory cell, the third voltage difference being different from the second voltage difference by a second predetermined voltage.

15. The method of claim 14, wherein:

the first bias voltage is independent of the location of the particular memory cell from the first contact; and the second bias voltage is dependent upon the location of the particular memory cell from the first contact.

16. The method of claim 14, wherein:

the first bias voltage is dependent upon the location of the particular memory cell from the first contact; and the second bias voltage is independent of the location of the particular memory cell from the first contact.

17. The method of claim 9, wherein:

the plurality of memory cells includes a last memory cell in the sequence and nearest a second contact electrically coupled to the bit line; and the first and second bias voltages differing by an amount further dependent upon a location of the particular memory cell from the second contact.

18. The method of claim 17, wherein:

the first bias voltage is independent of the respective locations of the particular memory cell from the first and second contacts; and the second bias voltage is dependent upon at least one of the respective locations of the particular memory cell from the first and second contacts.

19. The method of claim 17, wherein:

the first bias voltage is dependent upon at least one of the respective locations of the particular memory cell from the first and second contacts; and the second bias voltage is independent of the respective locations of the particular memory cell from the first and second contacts.

20. The method of claim 17, wherein:

the plurality of memory cells includes a third memory cell adjacent the last memory cell; and the first and last memory cells in the sequence have a first minimum threshold voltage corresponding to a programmed state, and the second and third memory cells have a second minimum threshold voltage corresponding to a programmed state, the first minimum threshold voltage being greater than the second minimum threshold voltage by a predetermined threshold voltage.

\* \* \* \* \*